US012796241B2

(12) United States Patent
Jung et al.

(10) Patent No.: US 12,796,241 B2
(45) Date of Patent: Nov. 10, 2026

(54) DISPLAY DEVICE AND METHOD OF MANUFACTURING THE SAME

(71) Applicant: Samsung Display Co., Ltd., Yongin-Si (KR)

(72) Inventors: Yang-Ho Jung, Seoul (KR); Hye Sun Kim, Goyang-si (KR); Jin-Su Byun, Seoul (KR); Junho Sim, Hwaseong-si (KR); Jaehun Lee, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 620 days.

(21) Appl. No.: 17/892,966

(22) Filed: Aug. 22, 2022

(65) Prior Publication Data

US 2023/0189577 A1 Jun. 15, 2023

(30) Foreign Application Priority Data

Dec. 10, 2021 (KR) ........................ 10-2021-0176440

(51) Int. Cl.
*H10K 59/124* (2023.01)
*H10K 50/844* (2023.01)
(Continued)

(52) U.S. Cl.
CPC ....... *H10K 59/124* (2023.02); *H10K 50/8445* (2023.02); *H10K 59/1213* (2023.02);
(Continued)

(58) Field of Classification Search
CPC ............. H10K 59/124; H10K 50/8445; H10K 59/1213; H10K 59/122; H10K 59/38; H10K 71/00; H10K 59/80517; H10K 59/80522; H10K 59/123; H10K 59/30; H10K 59/40; H10K 59/8731; H10K 71/40;
(Continued)

(56) References Cited

U.S. PATENT DOCUMENTS 10,535,722 B2 1/2020 You
10,802,401 B2 10/2020 Tanigaki et al.
(Continued)

FOREIGN PATENT DOCUMENTS

KR 10-2016-0124978 A 10/2016
KR 10-2019-0067410 A 6/2019
(Continued)

*Primary Examiner* — Chad M Dicke
*Assistant Examiner* — Gary Abel
(74) *Attorney, Agent, or Firm* — Innovation Counsel LLP

(57) ABSTRACT

A display device includes a display panel. The display panel includes a transistor, an insulating layer disposed on the transistor, a light emitting element electrically connected to the transistor and including a first electrode disposed on the insulating layer, a light emitting layer disposed on the first electrode, and a second electrode disposed on the light emitting layer, a stopper pattern disposed spaced apart from the first electrode, a pixel definition layer provided on the stopper pattern. A first opening extends through the pixel definition layer to the first electrode, and a second opening extends through the pixel defining layer to the stopper pattern. A thin film encapsulation layer disposed on the pixel definition layer and inside the second opening, covering the light emitting element.

14 Claims, 15 Drawing Sheets

(51) Int. Cl.

| | |
|---|---|
| ***H10K 59/121*** | (2023.01) |
| ***H10K 59/122*** | (2023.01) |
| ***H10K 59/38*** | (2023.01) |
| ***H10K 71/00*** | (2023.01) |

(52) U.S. Cl.
CPC ........... *H10K 59/122* (2023.02); *H10K 59/38* (2023.02); *H10K 71/00* (2023.02)

(58) Field of Classification Search
CPC .. H10K 71/421; H10K 71/441; H10K 59/126; H10K 59/80516
See application file for complete search history.

(56) References Cited

U.S. PATENT DOCUMENTS

| | | | | |
|---|---|---|---|---|
| 10,868,091 | B2 | 12/2020 | Choi et al. | |
| 11,444,140 | B2 | 9/2022 | Seo et al. | |
| 2014/0353626 | A1* | 12/2014 | Shim | H10K 50/86 359/601 |
| 2014/0367651 | A1* | 12/2014 | Song | H10K 59/805 257/40 |
| 2016/0035813 | A1* | 2/2016 | Lee | H10K 59/131 438/23 |
| 2016/0093680 | A1* | 3/2016 | Paek | H10K 59/805 438/34 |
| 2018/0329555 | A1* | 11/2018 | Kim | G06F 3/0418 |
| 2019/0051859 | A1* | 2/2019 | Choi | H10K 59/1213 |
| 2019/0206945 | A1* | 7/2019 | Lin | H10F 39/8053 |
| 2019/0237533 | A1* | 8/2019 | Kim | G06F 3/0412 |
| 2019/0363267 | A1* | 11/2019 | Tanaka | H05B 33/02 |
| 2019/0379006 | A1 | 12/2019 | Lim et al. | |
| 2020/0258961 | A1* | 8/2020 | Toyoda | H10K 59/122 |
| 2020/0371549 | A1* | 11/2020 | Park | H10K 59/65 |
| 2020/0410909 | A1* | 12/2020 | Jung | H10K 59/873 |
| 2021/0111232 | A1 | 4/2021 | Park et al. | |
| 2022/0102471 | A1* | 3/2022 | Jang | H10K 59/122 |
| 2022/0181399 | A1* | 6/2022 | Shim | H10K 59/353 |

FOREIGN PATENT DOCUMENTS

| | | | | |
|---|---|---|---|---|
| KR | 20190073695 | A * | 6/2019 | H01L 27/3262 |
| KR | 20210028789 | A | 3/2021 | |
| KR | 10-2021-0043792 | A | 4/2021 | |
| KR | 10-2022-0025965 | A | 3/2022 | |

* cited by examiner

DISPLAY DEVICE AND METHOD OF MANUFACTURING THE SAME

CROSS-REFERENCE TO RELATED APPLICATION(S)

This U.S. non-provisional patent application claims priority under 35 U.S.C. § 119 of Korean Patent Application No. 10-2021-0176440, filed on Dec. 10, 2021, the contents of which are hereby incorporated by reference in its entirety.

BACKGROUND

1. Field of Disclosure

The present disclosure relates to a display device and a method of manufacturing the same. More particularly, the present disclosure relates to a display device including a pixel definition layer and a method of manufacturing the display device.

2. Description of the Related Art

Display devices, such as smartphones, tablet computers, notebook computers, car navigation devices, smart televisions, are being developed. The display devices include a display device to provide information.

In the display device, a reflection phenomenon caused by an external natural light occurs. Due to the reflection phenomenon, a visibility of the display device is lowered. The display device includes an optical film to prevent the occurrence of the reflection phenomenon.

SUMMARY

The present disclosure provides a display device having improved strength against shear stress.

The present disclosure provides a method of manufacturing the display device.

In one aspect, the inventive concept provides a display device including a display panel. The display panel includes a transistor, an insulating layer disposed on the transistor, a light emitting element, a stopper pattern, a pixel definition layer, and a thin film encapsulation layer. The light emitting element is electrically connected to the transistor and includes a first electrode disposed on the insulating layer, a light emitting layer disposed on the first electrode, and a second electrode disposed on the light emitting layer. The stopper pattern is disposed spaced apart from the first electrode. The pixel definition layer is provided on the stopper pattern. The pixel definition layer has a first opening extends through the pixel definition layer to the first electrode and a second opening extends through the pixel defining layer to the stopper pattern. The thin film encapsulation layer is disposed on the pixel definition layer and inside the second opening, and covers the light emitting element.

The stopper pattern is disposed on the insulating layer and includes a same material as the first electrode.

The stopper pattern has a same layered structure as the first electrode.

The second electrode is disposed inside the second opening.

The thin film encapsulation layer includes a first inorganic layer, an organic layer disposed on the first inorganic layer, and a second inorganic layer disposed on the organic layer.

The stopper pattern is provided in plural, the second opening is provided in plural, and there is one of the stopper patterns at a base of the second openings.

The light emitting element includes a plurality of first color light emitting elements, a plurality of second color light emitting elements, and a plurality of third color light emitting elements. The stopper pattern is disposed in a non-light-emitting area defined between one light emitting element among the first color light emitting elements, the second light emitting elements adjacent to each other among the second color light emitting elements, and one light emitting element among the third color light emitting elements.

The stopper pattern is provided in plural, and two or more stopper patterns are disposed in the non-light-emitting area.

The pixel definition layer includes a first area having a first thickness and a second area having a second thickness smaller than the first thickness.

The second opening is defined in each of the first area and the second area.

The second opening defined in the second area further extends through the insulating layer.

The second opening has a depth greater than a width.

The display device further includes a connection electrode disposed between the transistor and the light emitting element and electrically connected to the transistor and the light emitting element. The stopper pattern is disposed under the insulating layer and include the same material as the connection electrode.

The transistor includes a semiconductor pattern and a gate, and the stopper pattern is disposed under the insulating layer and includes the same material as the gate.

The display device further includes an input sensor disposed on the display panel.

The display device further includes an anti-reflective unit disposed on the input sensor. The anti-reflective unit includes a color filter overlapping the first opening and a light blocking pattern overlapping the second opening.

In another aspect, the inventive concept provides a method of manufacturing a display device. The method includes forming a stopper pattern, forming a first electrode of a light emitting element spaced apart from the stopper pattern, forming a pixel definition layer on the insulating layer, the stopper pattern, and the first electrode; forming a first opening through the pixel definition layer to expose the first electrode of the light emitting element and remove some of the pixel definition layer covering the stopper pattern, providing a mask pattern on the pixel definition layer, wherein the mask pattern has an etching opening that corresponds to the stopper pattern, forming a second opening through the pixel definition layer to expose the stopper pattern, removing the mask pattern, forming a light emitting layer and a second electrode on the first electrode of the light emitting element, and forming a thin film encapsulation layer on the second electrode. The stopper pattern is formed prior to the first electrode of the light emitting element or is formed through the same process as the first electrode of the light emitting element. The mask pattern includes a transparent conductive oxide.

The second electrode is disposed inside the second opening.

The method further includes forming an inorganic layer on the second electrode and inside the second opening.

The method further includes forming a transistor and forming a connection electrode electrically connected to the transistor and the first electrode of the light emitting element. The stopper pattern is formed through a same process as a gate of the transistor or the connection electrode.

According to the above, as the thin film encapsulation layer is disposed in the second opening of the pixel definition layer, an adhesion of the thin film encapsulation layer with respect to a structure disposed thereunder is improved. Thus, a durability against a shear stress is improved.

The stopper pattern is disposed to overlap the second opening, and thus, a depth of the second opening is controlled. As the stopper pattern is formed through the same process as a conductive pattern of the display panel, an additional process is not required to process the stopper pattern.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1A:
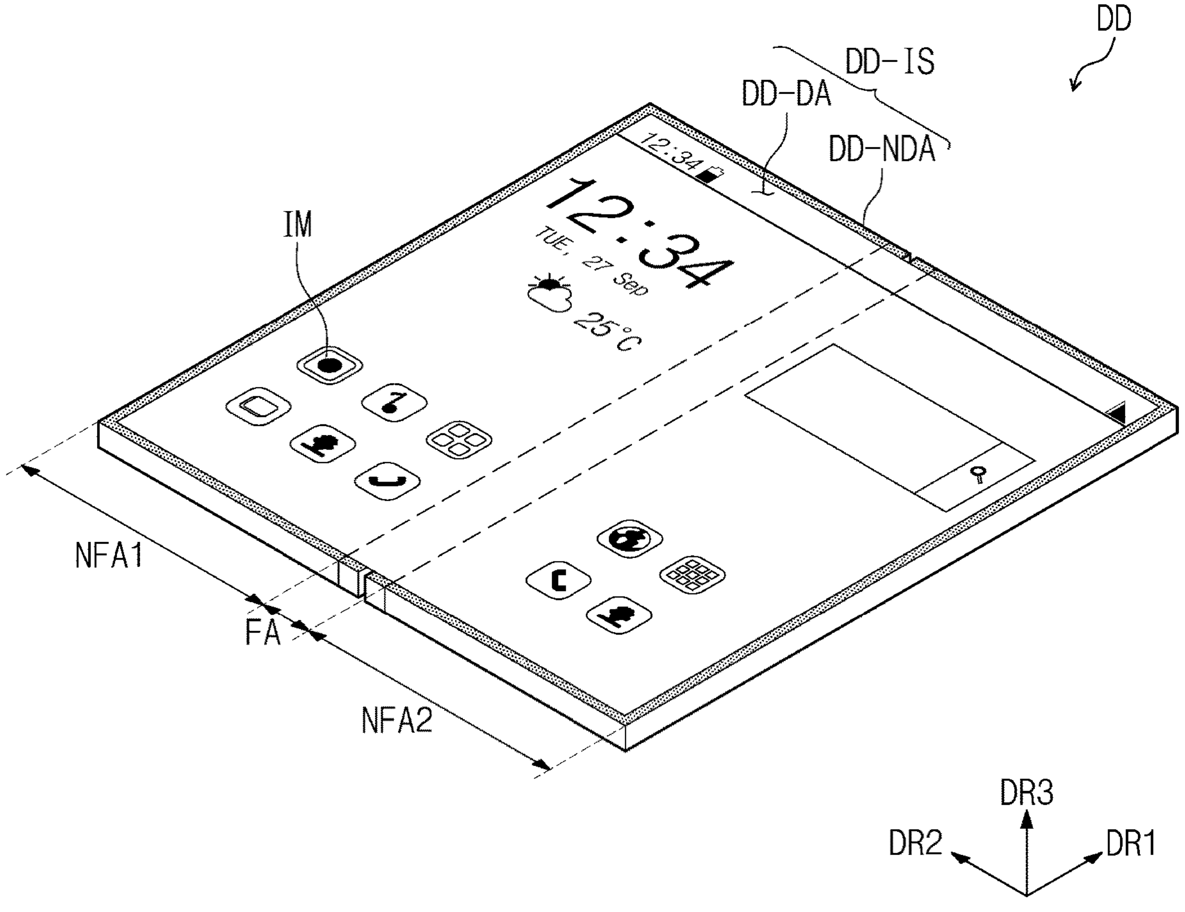
FIGS. 1A to 1C are perspective views of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 1B:
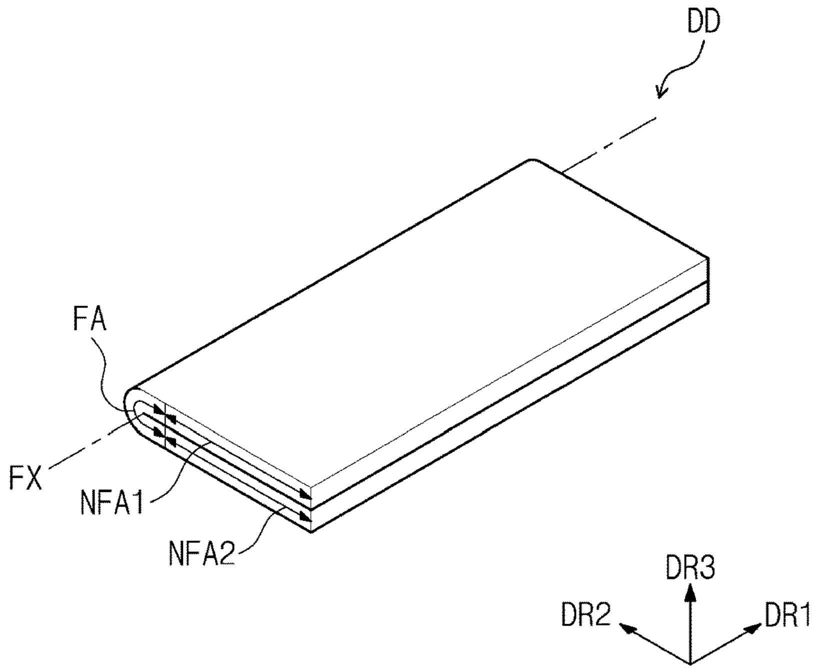
Figure 1C:
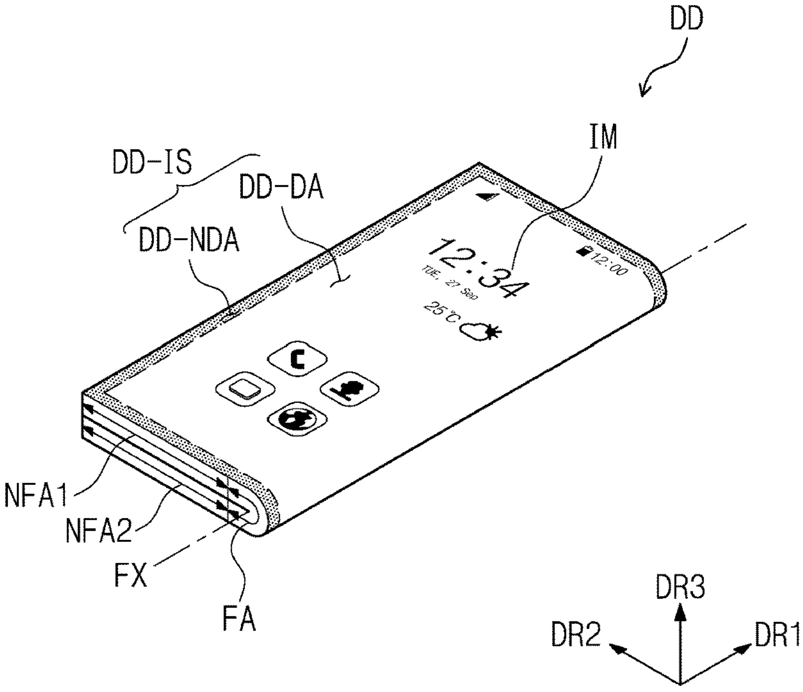

FIGS. 1A to 1C are perspective views of a display device DD according to an embodiment of the present disclosure.

Referring to FIGS. 1A to 1C, a display surface DD-IS may be substantially parallel to a plane defined by a first directional axis DR1 and a second directional axis DR2. A third directional axis DR3 may indicate a normal line direction that is orthogonal to the display surface DD-IS, and may also be referred to as a "thickness direction" of the display device DD. Front (or upper) and rear (or lower) surfaces of each member may be distinguished from each other with respect to the third directional axis DR3. Hereinafter, first, second, and third directions may correspond to directions respectively indicated by the first, second, and third directional axes DR1, DR2, and DR3 and may be assigned with the same reference numerals as the first, second, and third directional axes DR1, DR2, and DR3.

As shown in FIGS. 1A to 1C, the display surface DD-IS may include a display area DD-DA that displays an image IM and a non-display area DD-NDA adjacent to the display area DD-DA. The image IM may not be displayed through the non-display area DD-NDA. FIGS. 1A to 1C show icon images as a representative example of the image IM. As an example, the display area DD-DA may have a quadrangular shape. The non-display area DD-NDA may surround the display area DD-DA; however, this is not a limitation o the disclosure. The shape of the display area DD-DA and the shape of the non-display area DD-NDA may be designed in other ways in relation to each other.

As shown in FIGS. 1A to 1C, the display device DD may include a plurality of areas defined according to its operation state. The display device DD may include a folding area that includes a folding axis FX, a first flat area NFA1, and a second flat area NFA2. The folding area may be an area that substantially forms a curvature upon folding, as illustrated in FIG. 1B and FIG. 1C. The first flat area NFA1 and the second flat area NFA2 remain planar upon folding.

In the present embodiment, the display device DD provided with the folding axis FX substantially parallel to a major axis thereof is shown as a representative example. However, the present disclosure should not be limited thereto or thereby, and the folding axis FX may be substantially parallel to a minor axis of the display device DD. According to an embodiment, the display device DD may have a bar shape that is not folded.

Referring to FIG. 1B, the display device DD may be folded inwardly (inner-folding or inner-bending) such that the display surface DD-IS of the first flat area NFA1 may face the display surface DD-IS of the second flat area NFA2. Referring to FIG. 1C, the display device DD may be folded outwardly (outer-folding or outer-bending) such that the display surface DD-IS (both the first flat area NFA1 and the second flat area NFA2) may be exposed to the outside.

According to an embodiment, the display device DD may include a plurality of folding areas FA. In addition, the folding areas FA may be defined corresponding to a manner in which a user operates the display device DD. For instance, the folding area FA may be defined in a diagonal direction crossing the first directional axis DR1 and the second directional axis DR2 when viewed in a plane. The folding area FA may have a size determined depending on a radius of curvature without being fixed. According to an embodiment of the present disclosure, the display device DD may repeat only the operation mode illustrated in FIGS. 1A and 1B or may repeat only the operation mode illustrated in FIGS. 1A and 1C.

In the present embodiment, a foldable display device DD is shown as a representative example and should not be a limitation. The display device DD may be a flat display device or a rollable display device. In the present embodiment, the display device DD applied to a mobile phone is illustrated as a representative example. However, it should not be particularly limited. According to an embodiment, the display device DD may be incorporated into a large-sized electronic item, such as a television set and a monitor, and a small- and medium-sized electronic item, such as a tablet computer, a car navigation unit, a game unit, and a smart watch.

Figure 2:
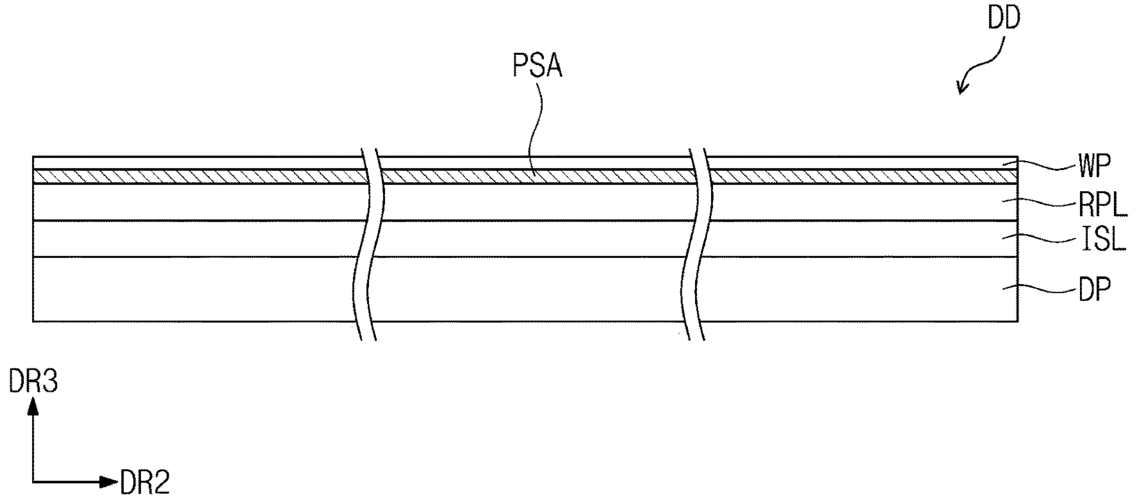
FIG. 2 is a cross-sectional view of a display device according to an embodiment of the present disclosure.

FIG. 2 is a cross-sectional view of the display device DD according to an embodiment of the present disclosure. FIG. 2 shows a cross-section defined by the second directional axis DR2 and the third directional axis DR3.

According to an embodiment, the display device DD may include a display panel DP, an input sensor ISL, an anti-reflective unit RPL, and a window WP. At least some components of the display panel DP, the input sensor ISL, the anti-reflective unit RPL, and the window WP may be formed through successive processes or may be attached to each other by an adhesive member.

Among the input sensor ISL, the anti-reflective unit RPL, and the window WP, a component that is formed through successive processes with another component is referred to as a "layer". Among the input sensor ISL, the anti-reflective unit RPL, and the window WP, a component that is coupled to another component by the adhesive member is referred to as a "panel". The panel includes a base layer providing a base surface, e.g., a synthetic resin film, a composite material film, or a glass substrate, however, the base layer may be omitted from the component that is referred to as the "layer". In other words, the component that is referred to as the "layer" is disposed on the base surface provided by another component. The input sensor, the anti-reflective unit, and the window may be respectively referred to as an input sensing panel, an anti-reflective panel, and a window panel, or an input sensing layer, an anti-reflective layer, and a window layer depending on the presence or absence of the base layer.

As shown in FIG. 2, the display device DD may include a display panel DP, an input sensing layer ISL, an anti-reflective layer RPL, and a window panel WP The input sensing layer ISL may be disposed directly on the display panel DP. In the present disclosure, the expression "a component B1 is disposed directly on a component A1" means that no adhesive members are present between the component B1 and the component A1. The component B1 may be formed on a base surface provided by the component A1 through successive processes after the component A1 is formed.

The display panel DP may generate the image, and the input sensing layer ISL may obtain coordinate information of the external input (e.g., a touch event). Although not shown in figures, a protective member may be further disposed under the display panel DP. The protective member may support the display panel DP and may protect the display panel DP from external impacts.

The display panel DP may be a light emitting type display panel. However, this is not a limitation of the disclosure. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter, the organic light emitting display panel will be described as a representative example of the display panel DP.

The anti-reflective layer RPL may reduce a reflectance with respect to a natural light (or a sunlight) incident thereto from above the window panel WP. According to an embodiment, the anti-reflective layer RPL may include a base layer and color filters. The color filters may have a predetermined arrangement. The arrangement of the color filters may be determined by taking into account emission colors of pixels included in the display panel DP. The anti-reflective layer RPL may further include a light blocking pattern disposed adjacent to the color filters.

Although shown schematically in figures, the window panel WP may include a base layer and a bezel pattern. The bezel pattern may define a bezel area of the display device DD, i.e., the non-display area DD-NDA (refer to FIG. 1A).

According to an embodiment, an adhesive layer may be disposed between the input sensing layer ISL and the anti-reflective layer RPL. According to an embodiment, the window panel WP may be disposed directly on the anti-reflective layer RPL.

Figure 3:
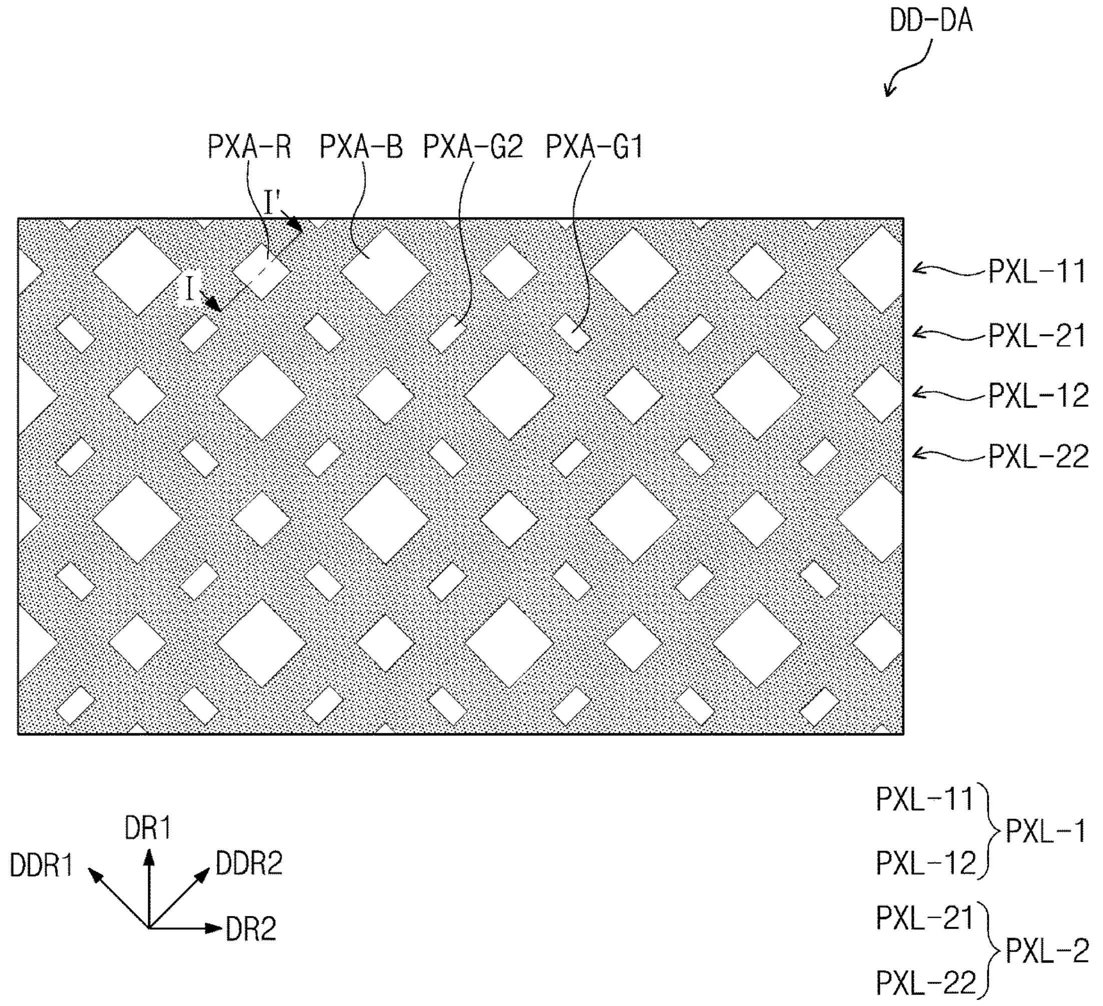
FIG. 3 is a plan view of a display area of a display device according to an embodiment of the present disclosure.

FIG. 3 is a plan view of the display area DD-DA of the display device according to an embodiment of the present disclosure.

Referring to FIG. 3, a plurality of pixel areas PXA-R, PXA-G1, PXA-G2, and PXA-B may be arranged in the display area DD-DA. A peripheral area NPXA may be defined adjacent to the pixel areas PXA-R, PXA-G1, PXA-G2, and PXA-B. The peripheral area NPXA may define a boundary of the pixel areas PXA-R, PXA-G1, PXA-G2, and PXA-B and may prevent a color mixture between the pixel areas PXA-R, PXA-G1, PXA-G2, and PXA-B. The pixel areas PXA-R, PXA-G1, PXA-G2, and PXA-B may define a plurality of pixel rows PXL-1 and PXL-2 extending in the second direction DR2. In FIG. 3, the second direction DR2 may be defined as an extension direction of the pixel rows PXL-1 and PXL-2 or a row direction, and the first direction DR1 may be defined as a column direction.

In the present embodiment, the pixel rows PXL-1 and PXL-2 may be classified into two groups. A first group of pixel rows PXL-1 may include a first color pixel area PXA-R generating a first color light and a second color pixel area PXA-B generating a second color light. The first color pixel areas PXA-R may be alternately arranged with the second color pixel areas PXA-B in the row direction DR2. The first group of pixel rows PXL-1 may include a first pixel row PXL-11 and a second pixel row PXL-12. The first pixel rows PXL-11 may be alternately arranged with the second pixel rows PXL-12 in the column direction DR1.

The first color pixel areas PXA-R and the second color pixel areas PXA-B of the first pixel row PXL-11 may be arranged differently from the first color pixel areas PXA-R and the second color pixel areas PXA-B of the second pixel row PXL-12. In the column direction DR1, the first color pixel area PXA-R of the first pixel row PXL-11 may be aligned with the second color pixel area PXA-B of the second pixel row PXL-12, and the second color pixel area PXA-B of the first pixel row PXL-11 may be aligned with the first color pixel area PXA-R of the second pixel row PXL-12.

A second group of pixel rows PXL-2 may include third color pixel areas PXA-G1 and PXA-G2 generating a third color light. The third color pixel areas PXA-G1 and PXA-G2 may be classified into two types of pixel areas, which include the light emitting areas with different shapes when viewed in a plane. When a first type area PXA-G1 is rotated at about 90 degrees in the plane, the first type area PXA-G1 may have substantially the same shape as that of a second type area PXA-G2. The first type area PXA-G1 may have a shape extending in a first cross direction DDR1, and the second type area PXA-G2 may have a shape extending in a second cross direction DDR2 crossing the first cross direction DDR1.

The first type areas PXA-G1 may be alternately arranged with the second type areas PXA-G2 in the row direction DR2. The second group of pixel rows PXL-2 may include a third pixel row PXL-21 and a fourth pixel row PXL-22. The third pixel rows PXL-21 may be alternately arranged with the fourth pixel rows PXL-22 in the column direction DR1.

The first type areas PXA-G1 and the second type areas PXA-G2 of the third pixel row PXL-21 may be arranged differently from the first type areas PXA-G1 and the second type areas PXA-G2 of the fourth pixel row PXL-22. In the column direction DR1, the first type areas PXA-G1 of the third pixel row PXL-21 may be aligned with the second type areas PXA-G2 of the fourth pixel row PXL-22, and the second type areas PXA-G2 of the third pixel row PXL-21 may be aligned with the first type areas PXA-G1 of the fourth pixel row PXL-22. However, they should not be limited thereto or thereby, and the second group of pixel rows PXL-2 may include pixel areas of one type having the light emitting area of the same shape when viewed in the plane.

The first group of pixel rows PXL-1 may be alternately arranged with the second group of pixel rows PXL-2 in the column direction DR1. One of the third pixel row PXL-21 and the fourth pixel row PXL-22 may be disposed between the first pixel row PXL-11 and the second pixel row PXL-12, which are consecutive to each other, and the other of the third pixel row PXL-21 and the fourth pixel row PXL-22 may be disposed between the second pixel row PXL-12 and another first pixel row PXL-11 that is consecutive to the second pixel row PXL-12.

In the present embodiment, the first color pixel area PXA-R, the second color pixel area PXA-B, and the third color pixel areas PXA-G1 and PXA-G2, which have different sizes in the planes, are shown as a representative example. The disclosure is not limited to the example provided. Among the light emitting areas, the size of the second color pixel area PXA-B has the greatest size, and the size of the third color pixel areas PXA-G1 and PXA-G2 has the smallest size, however, they should not be limited thereto or thereby.

In the present embodiment, the first color pixel area PXA-R may generate a red light, the second color pixel area PXA-B may generate a blue light, and the third color pixel areas PXA-G1 and PXA-G2 may generate a green light. The disclosure is not be limited to the embodiment that is provided. According to an embodiment, the color lights emitted from the first color pixel area PXA-R, the second color pixel area PXA-B, and the third color pixel areas PXA-G1 and PXA-G2 may be selected as a combination of three color lights that may generate a white light when being mixed.

Figure 4:
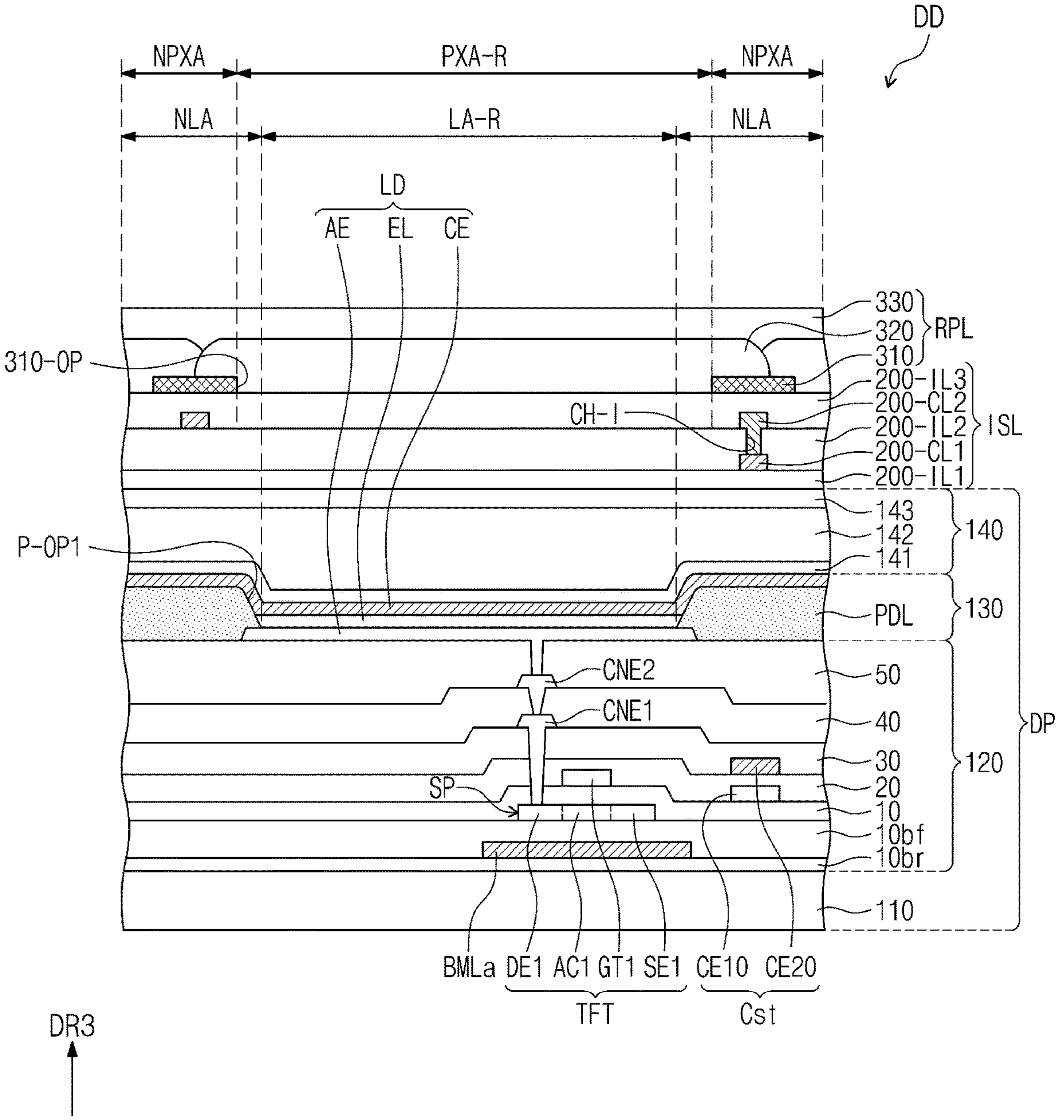
FIG. 4 is a cross-sectional view of a display device taken along a line I-I' of FIG. 3.

FIG. 4 is a cross-sectional view of the display device DD taken along a line I-I' of FIG. 3.

Hereinafter, a stack structure of the display device DD will be described based on a cross-section corresponding to the first color pixel area PXA-R. As shown in FIG. 4, the display device DD may include the display panel DP, the input sensing layer ISL, and the anti-reflective layer RPL, which are formed through sequential processes.

The display panel DP is illustrated focusing on a light emitting element LD and a transistor TFT electrically connected to the light emitting element LD. The transistor TFT may be one of a plurality of transistors included in a driving circuit of the pixel. In the present embodiment, the transistor TFT will be described as a silicon transistor, however, according to an embodiment, the transistor TFT may be a metal oxide transistor. According to an embodiment, the driving circuit of the pixel may include both the silicon transistor and the metal oxide transistor.

A barrier layer 10*br* may be disposed on a base layer 110. The barrier layer 10*br* may prevent a foreign substance from entering the display device DD from the outside. The barrier layer 10*br* may include at least one inorganic layer. The barrier layer 10*br* may include a silicon oxide layer and a silicon nitride layer. Each of the silicon oxide layer and the silicon nitride layer may be provided in plural, and the silicon oxide layers and the silicon nitride layers may be alternately stacked with each other.

A shielding electrode BMLa may be disposed on the barrier layer 10*br*. The shielding electrode BMLa may include a metal material. The shielding electrode BMLa may include molybdenum (Mo), an alloy including molybdenum (Mo), titanium (Ti), or an alloy including titanium (Ti), which has a good heat resistance. The shielding electrode BMLa may receive a bias voltage. The shielding electrode BMLa may receive a first power source voltage ELVDD. The shielding electrode BMLa may prevent an electric potential caused by a polarization phenomenon from exerting influence on the silicon transistor TFT. The shielding electrode BMLa may prevent an external light from reaching the transistor TFT. According to an embodiment, the shielding electrode BMLa may be a floating electrode isolated from other electrodes or lines.

A buffer layer 10*bf* may be disposed on the barrier layer 10*br*. The buffer layer 10*bf* may prevent metal atoms or impurities from being diffused to a semiconductor pattern SP disposed thereon from the base layer 110. The buffer layer 10*bf* may include at least one inorganic layer. The buffer layer 10*bf* may include a silicon oxide layer and a silicon nitride layer.

The semiconductor pattern SP may be disposed on the buffer layer 10*bf*. The semiconductor pattern SP may include a silicon semiconductor. As an example, the silicon semiconductor may include amorphous silicon or polycrystalline silicon. For example, the semiconductor pattern SP may include low temperature polycrystalline silicon.

The semiconductor pattern SP may have different electrical properties depending on whether it is doped or not or doped with an N-type dopant or a P-type dopant. The semiconductor pattern SP may include a high-doped region having a relatively high conductivity and a low-doped region having a relatively low conductivity. The high-doped region may be doped with an N-type dopant or a P-type dopant. A P-type transistor may include a doped region doped with the P-type dopant, and an N-type transistor may include a doped region doped with the N-type dopant. The low-doped region may be a non-doped region or a region doped at a concentration lower than that of the high-doped region.

The high-doped region may substantially serve as an electrode or a signal line. The low-doped region may substantially correspond to a channel area (or an active area) of the transistor. In other words, a portion of the semiconductor pattern SP may be a channel of the transistor, another portion of the semiconductor pattern may be a source or a drain of the transistor, and the other portion of the semiconductor pattern may be a connection electrode or a connection signal line.

A source area SE1, a channel area AC1 (or an active area), and a drain area DE1 of the transistor TFT may be formed from the semiconductor pattern SP. The source area SE1 and the drain area DE1 may extend in opposite directions to each other from the active area AC1 in a cross-section.

A first insulating layer 10 may be disposed on the buffer layer 10*bf*. The first insulating layer 10 may cover the semiconductor pattern SP. The first insulating layer 10 may include an inorganic layer. The first insulating layer 10 may include at least one of aluminum oxide, titanium oxide, silicon oxide, silicon nitride, silicon oxynitride, zirconium oxide, and hafnium oxide.

The first insulating layer 10 may have a single-layer structure of a silicon oxide layer, but this is not a limitation of the disclosure. Not only the first insulating layer 10, but also an inorganic layer of a circuit layer 120 described later may have a single-layer or multi-layer structure. The inorganic layer may include at least one of the above-mentioned materials. The structure or the materials described above are examples and not limitations of the disclosure.

A gate GT1 of the transistor TFT may be disposed on the first insulating layer 10. The gate GT1 may be a portion of a metal pattern. The gate GT1 may overlap the channel area AC1. The gate GT1 may be used as a mask in a process of doping the semiconductor pattern SP. The gate GT1 may include molybdenum (Mo), an alloy including molybdenum (Mo), titanium (Ti), an alloy including titanium (Ti), or the like, which has a good heat resistance. These materials are examples, not limitations of the disclosure.

A first electrode CE10 of a storage capacitor Cst may be disposed on the first insulating layer 10. In FIG. 4, the gate GT1 and the first electrode CE10 are spaced apart from each other. In other embodiments, the first electrode CE10 may extend from the gate GT1 when viewed in a plane and may be provided integrally with the gate GT1.

In the present embodiment, the gate GT1 and the first electrode CE10 may be formed through the same process. Accordingly, the gate GT1 and the first electrode CE10 may include the same material and may have the same structure.

A second insulating layer 20 may be disposed on the first insulating layer 10 and may cover the gate GT1 and the first electrode CE10. The second insulating layer 20 may include at least one of aluminum oxide, titanium oxide, silicon oxide, silicon nitride, silicon oxynitride, zirconium oxide, and hafnium oxide. The second insulating layer 20 may have a multi-layer structure of inorganic layers.

A second electrode CE20 of the storage capacitor Cst may be disposed on the second insulating layer 20. The third insulating layer 30 may be disposed on the second insulating layer 20. A third insulating layer 30 may cover the second electrode CE20 of the storage capacitor Cst.

A first connection electrode CNE1 may be disposed on the third insulating layer 30. The first connection electrode CNE1 may be connected to the drain area DE1 of the transistor TFT via a contact hole defined through the first, second, and third insulating layers 10, 20, and 30.

A fourth insulating layer 40 may be disposed on the third insulating layer 30. A second connection electrode CNE2 may be disposed on the fourth insulating layer 40. The second connection electrode CNE2 may be connected to the first connection electrode CNE1 via a contact hole defined through the fourth insulating layer 40. A fifth insulating layer 50 may be disposed on the fourth insulating layer 40 and may cover the second connection electrode CNE2. Although not shown separately, a data line may be disposed on the same layer as a layer on which one of the first connection electrode CNE1 and the second connection electrode CNE2 is disposed.

The layered structure of the first insulating layer 10, the second insulating layer 20, the third insulating layer 30, the fourth insulating layer 40, and the fifth insulating layer 50 is merely an example, and a conductive layer and an insulating layer may be further disposed in addition to the first insulating layer 10 to the fifth insulating layer 50.

Each of the fourth insulating layer 40 and the fifth insulating layer 50 may include an organic layer. As an example, the organic layer may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting element LD may include a first electrode AE, a light emitting layer EL, and a second electrode CE. The first electrode AE may be disposed on the fifth insulating layer 50. The first electrode AE may include a reflective electrode formed. According to an embodiment, the first electrode AE may include a reflective layer formed of silver (Ag), magnesium (Mg), aluminum (Al), platinum (Pt), lead (Pd), gold (Au), nickel (Ni), neodymium (Nd), iridium (Ir), chromium (Cr), or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnOx), indium oxide (In2O3), and aluminum-doped zinc oxide (AZO). For instance, the first electrode AE may have a stack structure of ITO/Ag/ITO.

A pixel definition layer PDL may be disposed on the fifth insulating layer 50. According to an embodiment, the pixel definition layer PDL may have a light absorbing property. For example, the pixel definition layer PDL may have a black color. The pixel definition layer PDL may include a base resin and a black coloring agent mixed with the base resin. The pixel definition layer PDL may include an acrylic-based resin as the base resin. The black coloring agent may include a black dye or a black pigment. The black coloring agent may include a metal material, such as carbon black, chromium, or an oxide thereof. The pixel definition layer PDL may correspond to a light blocking pattern having a light blocking property.

The pixel definition layer PDL may cover a portion of the first electrode AE. As an example, a first opening P-OP1 may be defined through the pixel definition layer PDL to expose a portion of the first electrode AE. The first opening P-OP1 of the pixel definition layer PDL may define a light emitting area LA-R. An "opening," as used herein, is intended to mean a discontinuous portion of a layer, such as the pixel definition layer PDL, characterized by a regional absence of the layer material.

The pixel definition layer PDL may increase a distance between an edge of the first electrode AE and the second electrode CE. Accordingly, the pixel definition layer PDL may prevent an occurrence of an arc in the edge of the first electrode AE.

Although not shown in figures, a hole control layer may be disposed between the first electrode AE and the light emitting layer EL. The hole control layer may include a hole transport layer and may further include a hole injection layer. An electron control layer may be disposed between the light emitting layer EL and the second electrode CE. The electron control layer may include an electron transport layer and may further include an electron injection layer.

A thin film encapsulation layer 140 may be disposed on a light emitting element layer 130. The thin film encapsulation layer 140 may include an inorganic layer 141, an organic layer 142, and an inorganic layer 143, which are sequentially stacked. However, layers forming the thin film encapsulation layer 140 should not be limited by these examples.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, this is not a limitation of the disclosure.

Referring to FIG. 4, the input sensing layer ISL may be disposed directly on the thin film encapsulation layer 140. The input sensing layer ISL may include a first insulating layer 200-IL1, a first conductive layer 200-CL1, a second insulating layer 200-IL2, a second conductive layer 200-CL2, and a third insulating layer 200-IL3. According to an embodiment, the first insulating layer 200-IL1 or the third insulating layer 200-IL3 may be omitted.

Each of the first conductive layer 200-CL1 and the second conductive layer 200-CL2 may have a single-layer structure or may have a multi-layer structure of layers stacked along the third directional axis DR3. The multi-layered conductive pattern may include at least two layers among transparent conductive layers and metal layers. The multi-layered conductive pattern may include the metal layers containing different metal materials from each other. The transparent conductive layer may include indium tin oxide (ITO), indium zinc oxide (IZO), zinc oxide (ZnO), indium tin zinc oxide (ITZO), PEDOT, a metal nanowire, or graphene. The metal layer may include molybdenum, silver, titanium, copper, aluminum, and alloys thereof. For instance, each of the first conductive layer 200-CL1 and the second conductive layer 200-CL2 may have a three-layer structure of metal layers, e.g., a three-layer structure of titanium/aluminum/titanium. The metal layers with a relatively high durability and a low reflectance may be provided as upper and lower layers, and the metal layer with a relatively high electrical conductivity may be provided as an inner layer.

Each of the first conductive layer 200-CL1 and the second conductive layer 200-CL2 may include a plurality of conductive patterns. The first conductive layer 200-CL1 may include first conductive patterns, and the second conductive layer 200-CL2 may include second conductive patterns. Each of the first conductive patterns and the second conductive patterns may include sensing electrodes and signal lines connected to the sensing electrodes. One of the first conductive patterns may be connected to a corresponding second conductive pattern among the second conductive patterns via a contact hole CH-I defined through the second insulating layer 200-IL2. The first conductive patterns and the second conductive patterns may be disposed to overlap a light blocking pattern 310. The light blocking pattern 310 may prevent the external light from being reflected by the first conductive patterns and the second conductive patterns.

Each of the first insulating layer 200-IL1, the second insulating layer 200-IL2, and the third insulating layer 200-IL3 may include an inorganic layer or an organic layer. According to an embodiment, the first insulating layer 200-IL1 and the second insulating layer 200-IL2 may include the inorganic layer. The third insulating layer 200-IL3 may include the organic layer.

The anti-reflective layer RPL may be disposed directly on the input sensor layer ISL. The anti-reflective layer RPL may include the light blocking pattern 310, the color filter 320, and a planarization layer 330.

A material for the light blocking pattern 310 should not be limited as along as the material absorbs light. The light blocking pattern 310 may have a black color. The light blocking pattern 310 may include a black coloring agent. The black coloring agent may include a black dye or a black pigment. The black coloring agent may include a metal material, such as carbon black, chromium, or an oxide thereof.

The light blocking pattern 310 may overlap the first conductive patterns and the second conductive patterns. An opening 310-OP may be defined through the light blocking pattern 310. The opening 310-OP of the light blocking pattern 310 may be aligned with the first electrode AE and may have a size greater than that of the first opening P-OP1 of the pixel definition layer PDL. The opening 310-OP of the light blocking pattern 310 may define the pixel area PXA-R. The pixel area PXA-R may correspond to an area from which the light generated by the light emitting element LD exits to the outside. As the size of the pixel area PXA-R increases, a luminance of the image may increase.

The color filter 320 may overlap at least the pixel area PXA-R. The color filter 320 may further overlap the peripheral area NPXA. A portion of the color filter 320 may be disposed on the light blocking pattern 310. The color filter 320 may transmit the light generated by the light emitting element LD and may block a portion of the external light in some wavelength bands. Accordingly, the color filter 320 may reduce the reflection of the external light, which is caused by the first electrode AE or the second electrode CE.

The planarization layer 330 may cover the light blocking pattern 310 and the color filter 320. The planarization layer 330 may include an organic material and may provide a flat upper surface thereon.

Figure 5A:
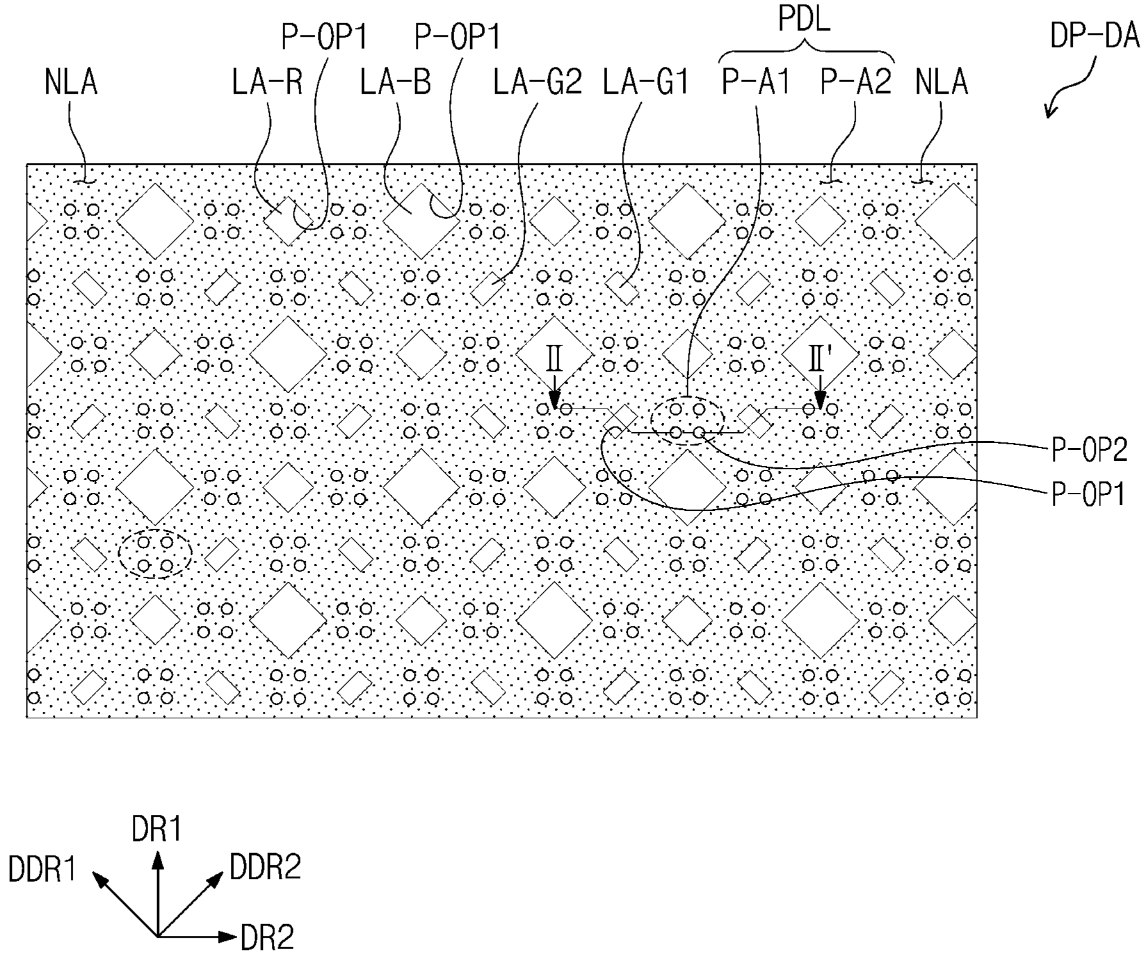
FIGS. 5A and 5B are plan views of a display area of a display panel according to embodiments of the present disclosure.
Figure 5B:
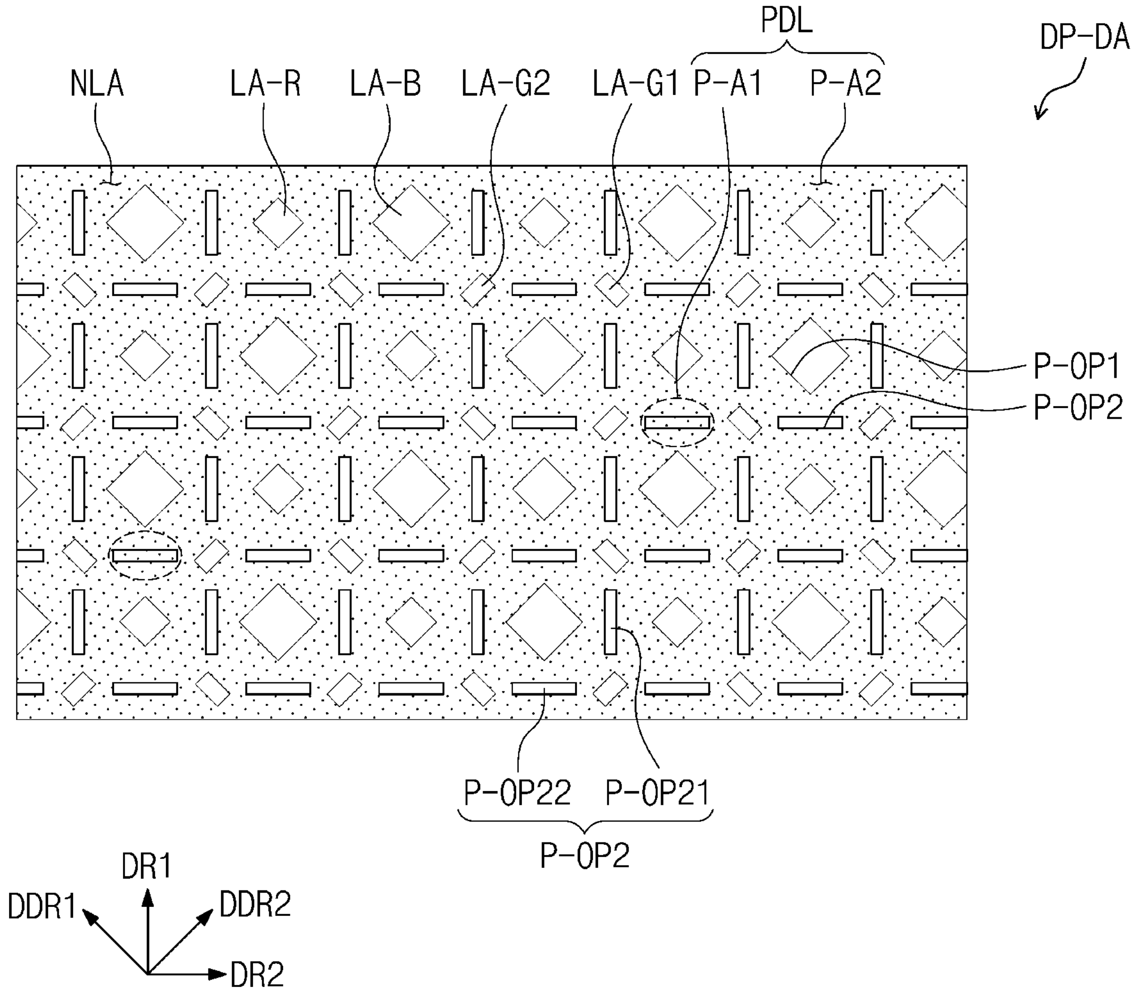
Figure 6:
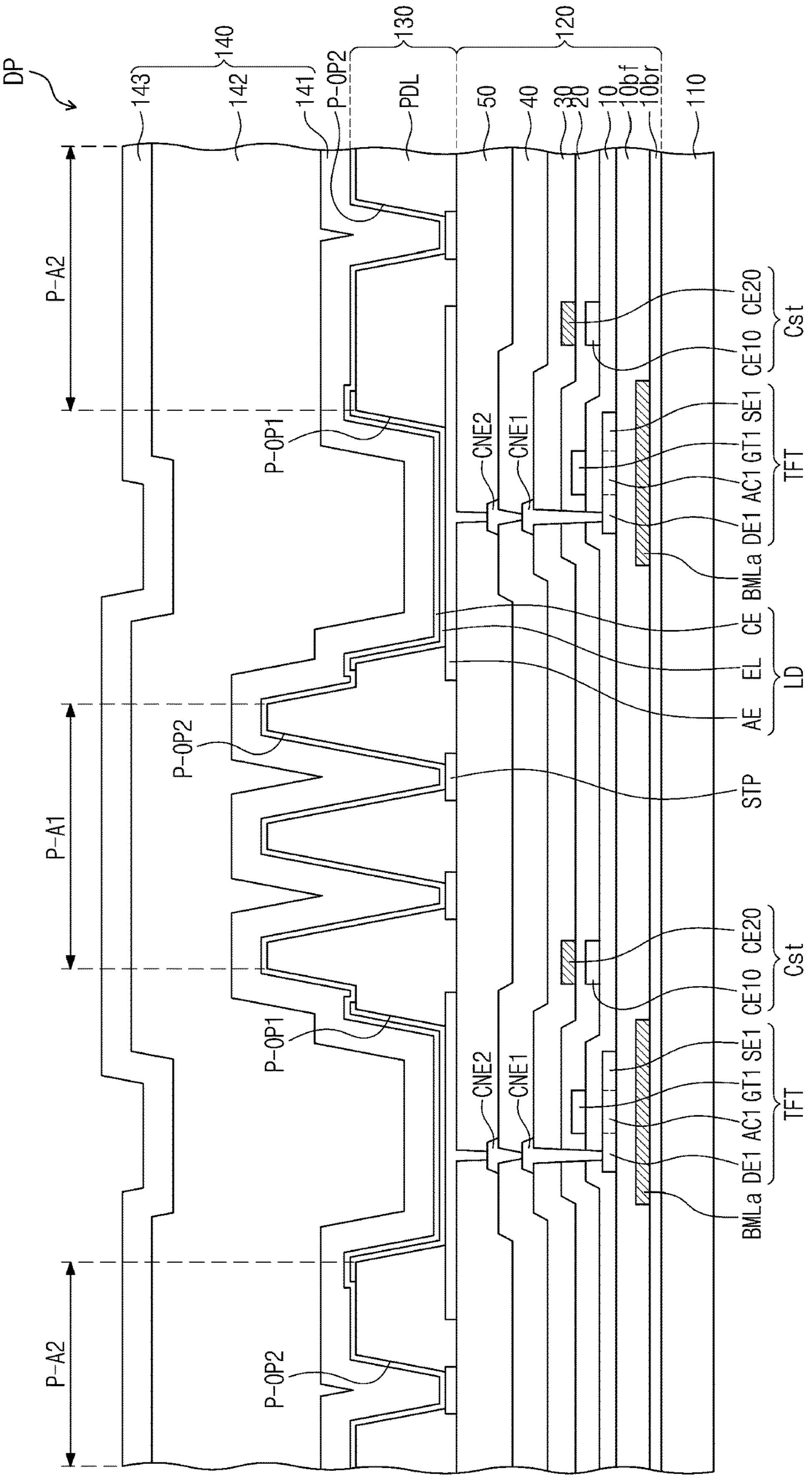
FIG. 6 is a cross-sectional view taken along a line II-II' of FIG. 5A.

FIGS. 5A and 5B are plan views of a display area DP-DA of a display panel according to embodiments of the present disclosure. FIG. 6 is a cross-sectional view taken along a line II-II' of FIG. 5A.

Referring to FIG. 5A, the first openings P-OP1 of the pixel definition layer PDL may define first color light emitting areas LA-R, second color light emitting areas LA-B, and third color light emitting areas LA-G1 and LA-G2. A first color light emitting element may be disposed in each of the first color light emitting areas LA-R, a second color light emitting element may be disposed in each of the second color light emitting areas LA-B, and a third color light emitting element may be disposed in each of the third color light emitting areas LA-G1 and LA-G2. An area in which the pixel definition layer PDL is disposed may correspond to a non-light-emitting area NLA.

The first color light emitting areas LA-R, the second color light emitting areas LA-B, and the third color light emitting areas LA-G1 and LA-G2 may correspond to the first color pixel areas PXA-R, the second color pixel areas PXA-B, and the third color pixel areas PXA-G1 and PXA-G2, respectively, shown in FIG. 3. A relation between the light emitting area and the pixel area, which correspond to each other, refers to a relation between the first color light emitting area LA-R and the first color pixel area PXA-R shown in FIG. 4.

Second openings P-OP2 may be further defined through the pixel definition layer PDL. FIG. 5A shows four second openings P-OP2 arranged to form one group as a representative example.

One group of the second openings P-OP2 may be disposed in the non-light-emitting area NLA defined between one first color light emitting area LA-R, one second color light emitting area LA-B, and two third color light emitting areas LA-G1 and LA-G2. Groups of the second openings P-OP2 may be regularly arranged in rows and columns. The number of the second openings P-OP2 forming the one group should not be particularly limited.

FIG. 5B shows second openings P-OP2 having different shape and arrangement from those of the second openings P-OP2 of FIG. 5A as a representative example. The second openings P-OP2 may include openings P-OP21 extending in the first direction DR1 and openings P-OP22 extending in the second direction DR2.

The opening P-OP21 extending in the first direction DR1 or the opening P-OP22 extending in the second direction DR2 may be disposed in a non-light-emitting area NLA defined between one first color light emitting area LA-R, one second color light emitting area LA-B, and two third color light emitting areas LA-G1 and LA-G2. Each of the first color light emitting area LA-R, the second color light emitting area LA-B, and the third color light emitting areas LA-G1 and LA-G2 may be surrounded by two openings P-OP21 extending in the first direction DR1 and two openings P-OP22 extending in the second direction DR2.

Referring to FIG. 6, the pixel definition layer PDL may have a first thickness in a first area P-A1 and a second thickness smaller than the first thickness in a second area P-A2. The first area P-A1 may correspond to a spacer that supports a deposition mask used to form the light emitting layer EL. The second openings P-OP2 may be defined in each of the first area P-A1 and the second area P-A2.

Referring to FIG. 6, the second openings P-OP2 may extend through at least the pixel definition layer PDL. Each of the second openings P-OP2 may expose a stopper pattern STP. In the present embodiment, plural stopper patterns STP respectively corresponding to the second openings P-OP2 are shown as a representative example. However, it should not be particularly limited. The stopper pattern STP may be disposed in each group of the second openings P-OP2 shown in FIG. 5A. For instance, one stopper pattern STP may be disposed to correspond to two second openings P-OP2 defined in the first area P-A1 of FIG. 6.

The stopper pattern STP stops the etching of the pixel definition layer PDL in a process of forming the second opening P-OP2, and thus controls a depth of the second opening P-OP2. In the present embodiment, the stopper pattern STP may be disposed on the fifth insulating layer 50.

In the present embodiment, the stopper pattern STP may be formed through the same process as the first electrode AE. The stopper pattern STP may include the same material as that of the first electrode AE. The stopper pattern STP may have the same stack structure as that of the first electrode AE. When the first electrode AE has a multi-layer structure of ITO/Ag/ITO, the stopper pattern STP may have the multi-layer structure of ITO/Ag/ITO or a multi-layer structure of ITO/Ag. The reason why the stopper pattern STP has the multi-layer structure of ITO/Ag is because ITO disposed at an upper portion may be removed in the process of forming the second opening P-OP2 or a subsequent process.

The stopper pattern STP may be disposed spaced apart from the first electrode AE when viewed in a plane. Accordingly, a short circuit between the first electrodes AE adjacent to each other may be prevented.

At least a portion of the thin film encapsulation layer 140 may be disposed inside the second opening P-OP2. As show in FIG. 6, a portion of the inorganic layer 141 may be disposed in the second opening P-OP2. A portion of the organic layer 142 may also be disposed in the second opening P-OP2. However, this is not a limitation or a requirement of the disclosure.

A portion of the second electrode CE may also be disposed inside the second opening P-OP2. In the second opening P-OP2, the second electrode CE may be disposed under the inorganic layer 141. Although not shown in figures, in the second opening P-OP2, the electron transport layer and the hole transport layer disposed under the electron transport layer may be disposed under the second electrode CE.

As the portion of the second electrode CE is disposed inside the second opening P-OP2, a coupling force of the second electrode CE with respect to the light emitting element layer 130 may increase. In addition, as the portion of the inorganic layer 141 is disposed inside the second opening P-OP2, a coupling force of the inorganic layer 141 with respect to the light emitting element layer 130 may increase. This is because a coupling area between the inorganic layer 141 and the second opening P-OP2 increases.

Due to a tension generated in the inorganic layer 141, a compressive force may be applied to an inner surface of the opening P-OP2 by the portion of the inorganic layer 141 disposed inside the opening P-OP2. Accordingly, a coupling force of the inorganic layer 141 with respect to the inner surface of the opening P-OP2 may increase.

For the above reasons, the second electrode CE and the inorganic layer 141 may not be separated from the structure disposed thereunder even though the shear stress is applied. Consequently, a durability of the display panel DP against the shear stress may be improved.

The second opening P-OP2 may have a depth greater than its width. Where the second opening P-OP2 has a circular shape in plan view as shown in FIG. 5A, the "width" is the diameter, or the maximum distance across the circle. Where the second opening P-OP2 has a rectangular shape in plan view as shown in FIG. 5B, the width is the distance of the shorter side. As the ratio of depth to width increases, the coupling force of the second electrode CE and inorganic layer 141 with respect to the second opening P-OP2 may increase.

A ratio of the width to depth may be 1:1 to 1:3. For instance, a ratio of the width to the depth of the second opening P-OP2 defined in the first area P-A1 may be 1:3. A ratio of the diameter to the depth of the second opening P-OP2 defined in the second area P-A2 may be 1:1.5. However, cases where the width is larger than the depth are not excluded from the scope of the present disclosure.

FIGS. 7A to 7F are cross-sectional views of a method of manufacturing the display device DD according to an embodiment of the present disclosure. Hereinafter, the cross-sectional views of FIGS. 7A to 7F are shown with respect to the cross-section of FIG. 6, and in FIGS. 7A to 7F, detailed descriptions of the components described with reference to FIG. 6 will be omitted.

Figure 7A:
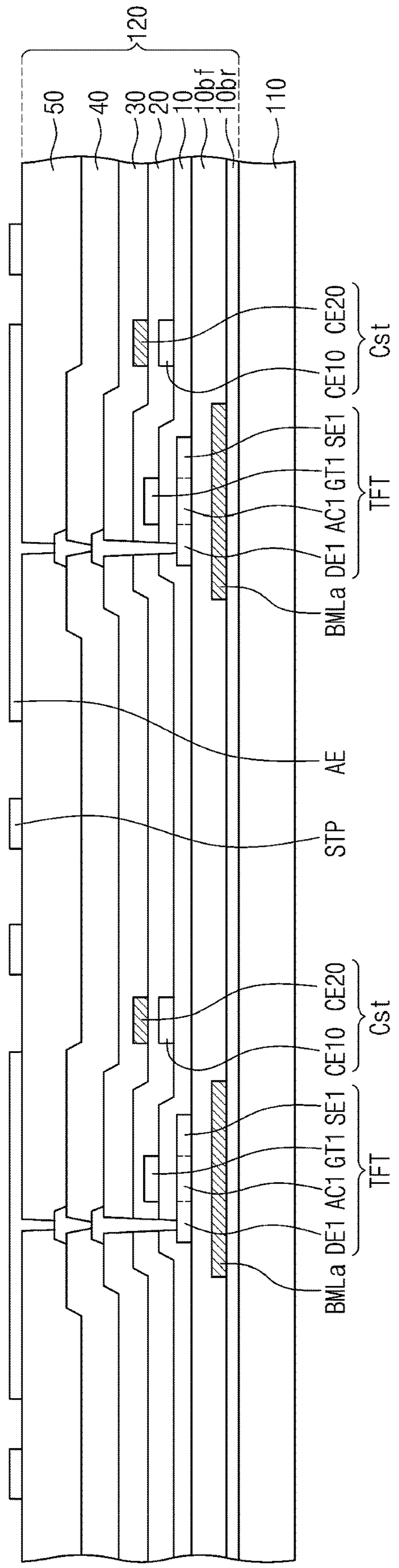
FIGS. 7A to 7F are cross-sectional views of a method of manufacturing a display device according to an embodiment of the present disclosure.

Referring to FIG. 7A, a pixel circuit and the insulating layers 10*br*, 10*bf*, and 10 to 50 may be disposed on the base layer 110. The transistor TFT and the capacitor Cst are shown as the pixel circuit.

Each of the patterns of the transistor TFT and the capacitor Cst may be formed through a deposition process of the conductive layer or the semiconductor layer, a photolithography process of the conductive layer or the semiconductor layer, and an etching process of the conductive layer or the semiconductor layer. Each of the insulating layers 10*br*, 10*bf*, 10, 20, 30, 40, and 50 may be formed by a deposition process of an inorganic material or an organic material.

Referring to FIG. 7A, the stopper pattern STP and the first electrode AE may be formed on the fifth insulating layer 50, for example by forming a conductive layer and patterning it using a photolithography process and an etching process. The conductive layer may have the multi-layer structure of ITO/Ag/ITO.

Figure 7B:
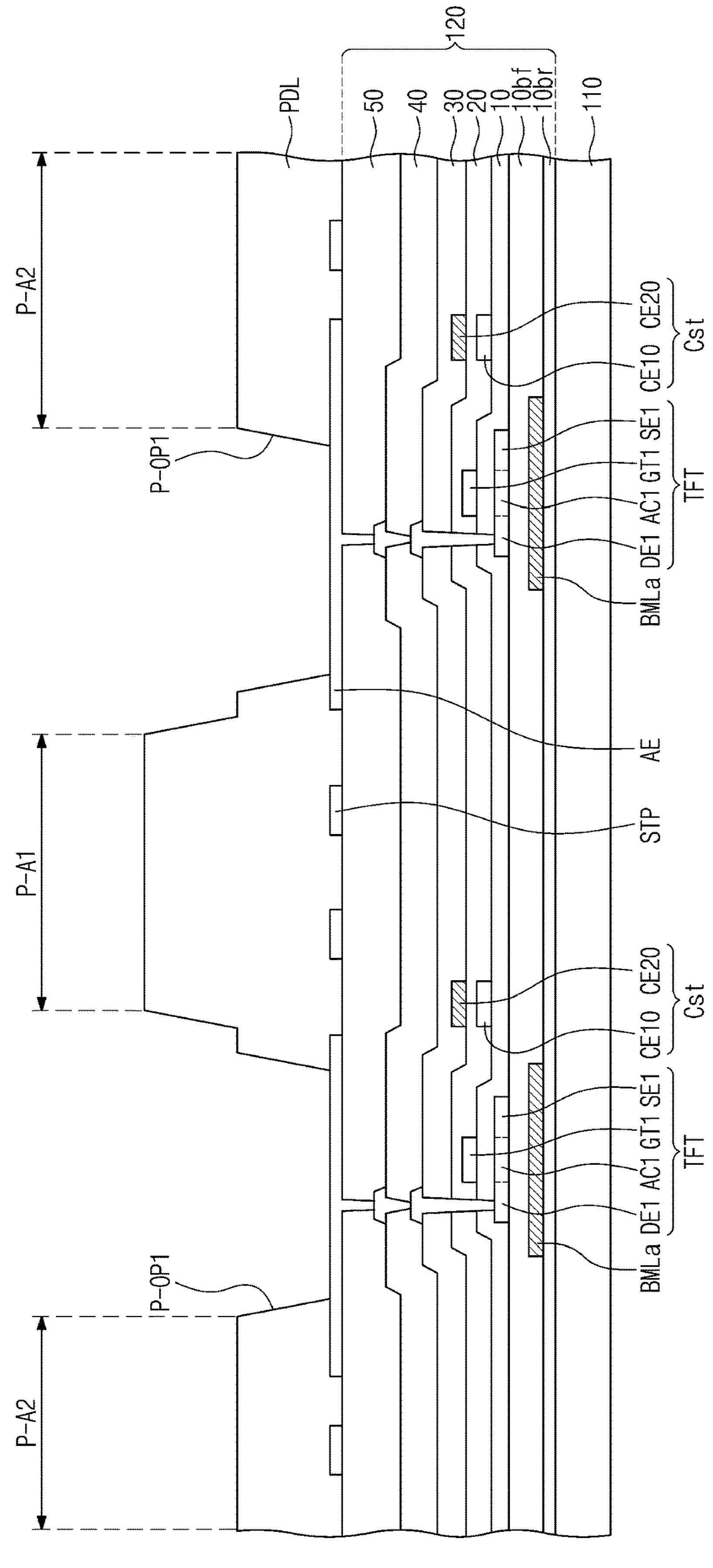

Then, as shown in FIG. 7B, the pixel definition layer PDL may be formed on the fifth insulating layer 50 to cover the stopper pattern STP and the first electrode AE. The first opening P-OP1 may be defined through the pixel definition layer PDL to expose the first electrode AE.

In the present embodiment, the pixel definition layer PDL may include a negative photosensitive resin material. After a negative photosensitive resin layer is formed, the negative photosensitive resin layer may be exposed and developed using a halftone mask, and thus, the pixel definition layer PDL may be patterned. Portions of the negative photosensitive resin layer, which are not exposed, may be removed through an etching process. As a result of the above process, the pixel definition layer PDL divided into a plurality of areas may be formed.

The first opening P-OP1 may be formed by a light blocking area of the halftone mask, the first area P-A1 may be formed by an opening area of the halftone mask, and the second area P-A2 that is partially removed may overlap a slit area or a gradation area of the halftone mask. In the present embodiment, the negative photosensitive resin material is described as a representative example. However, the present disclosure should not be limited to the negative photosensitive resin material. The pixel definition layer PDL may include a positive photosensitive resin material.

Figure 7C:
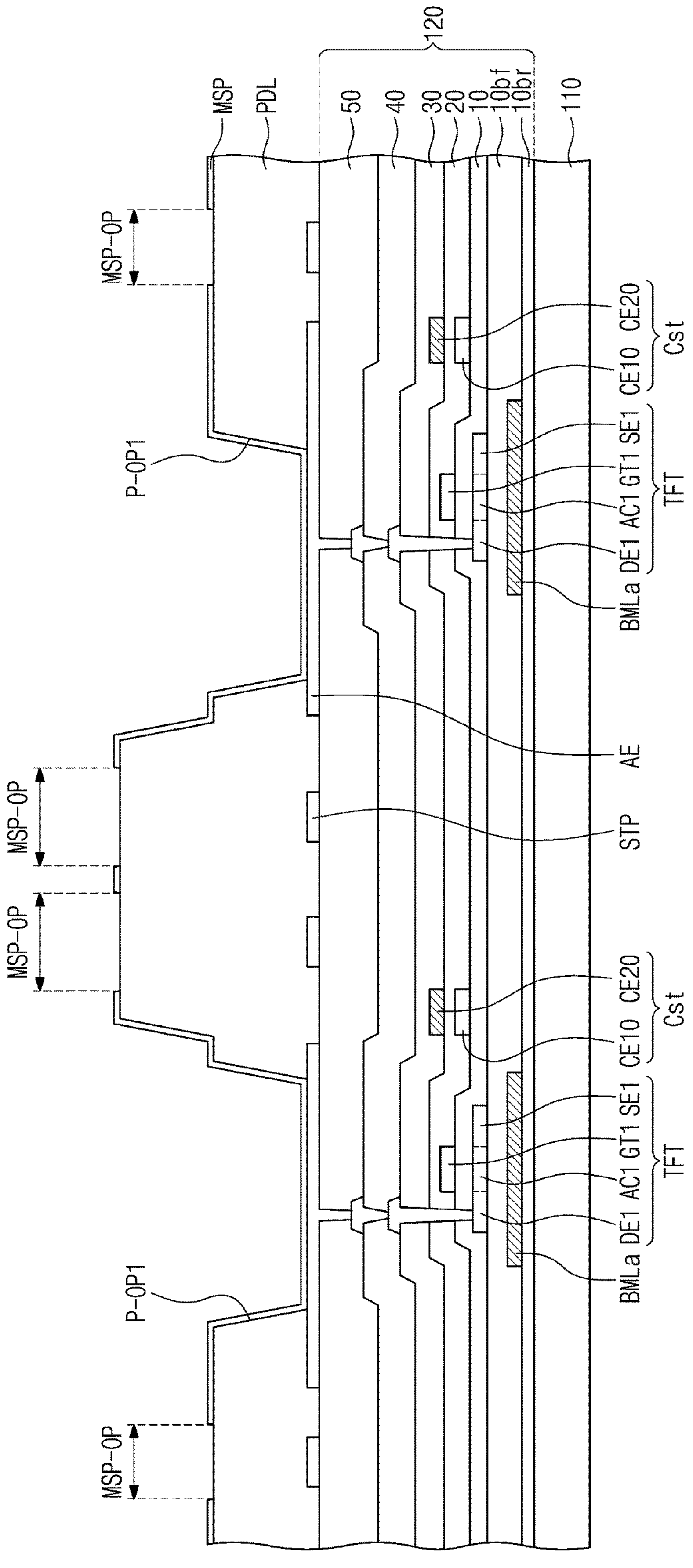

Referring to FIG. 7C, a mask pattern MSP through which an etching opening MSP-OP is defined corresponding to the stopper pattern STP may be formed on the pixel definition layer PDL. The mask pattern MSP may include a transparent conductive oxide. The mask pattern MSP may include indium tin oxide (ITO), indium zinc oxide (IZO), indium gallium zinc oxide (IGZO), zinc oxide (ZnOx), indium oxide (In2O3), or aluminum-doped zinc oxide (AZO).

After a transparent conductive oxide layer is formed, the etching opening MSP-OP may be formed through the transparent conductive oxide layer using a photolithography process and an etching process.

Figure 7D:
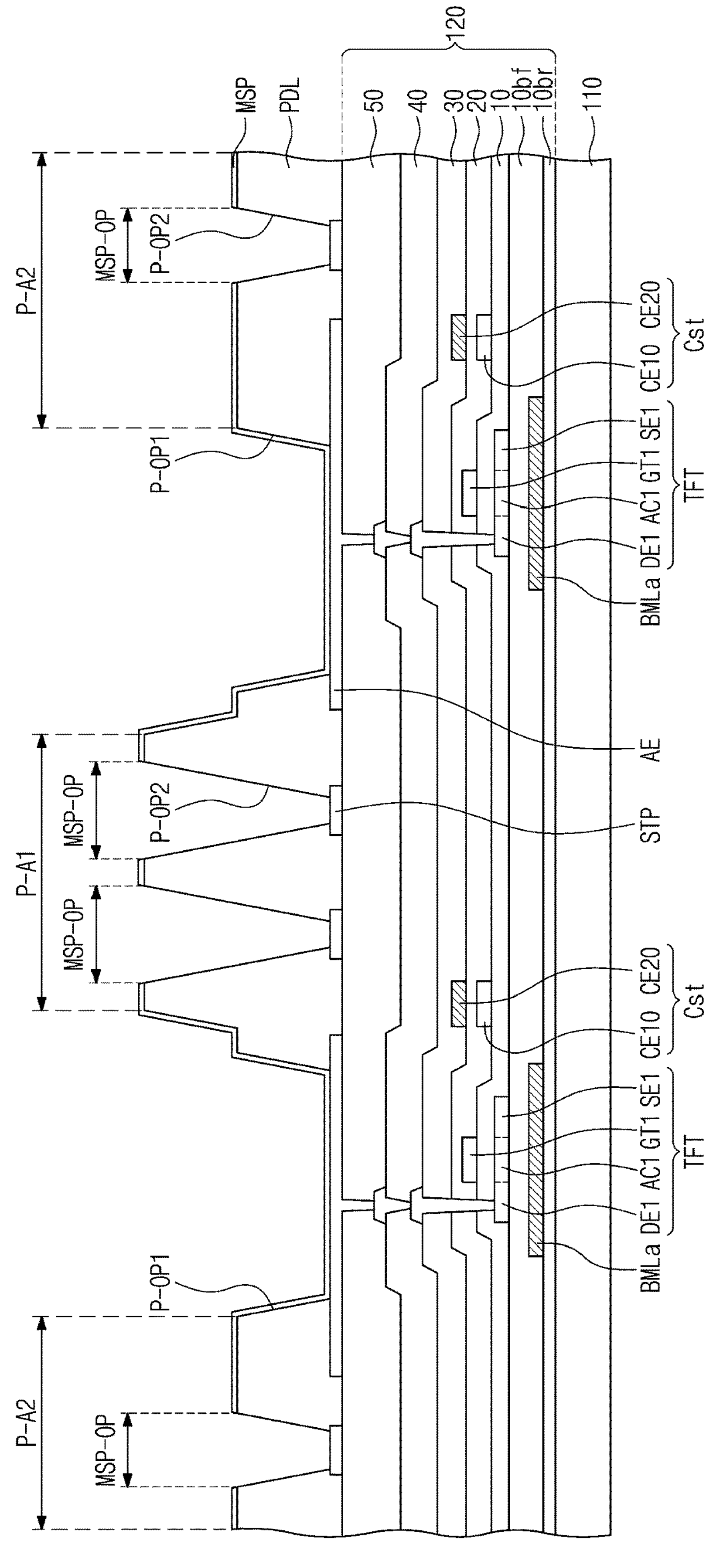

Referring to FIG. 7D, the second opening P-OP2 may be formed through the pixel definition layer PDL using the mask pattern MSP to expose the stopper pattern STP. The pixel definition layer PDL and the mask pattern MSP may have different etch rates with respect to an etchant or an etching gas. For instance, the pixel definition layer PDL may be etched using oxygen plasma, but the mask pattern MSP including a metal material may not be etched by the oxygen plasma. Accordingly, the etching of the pixel definition layer PDL may be stopped by the stopper pattern STP, and the depth of the second opening P-OP2 may be determined by the stopper pattern STP.

Figure 7E:
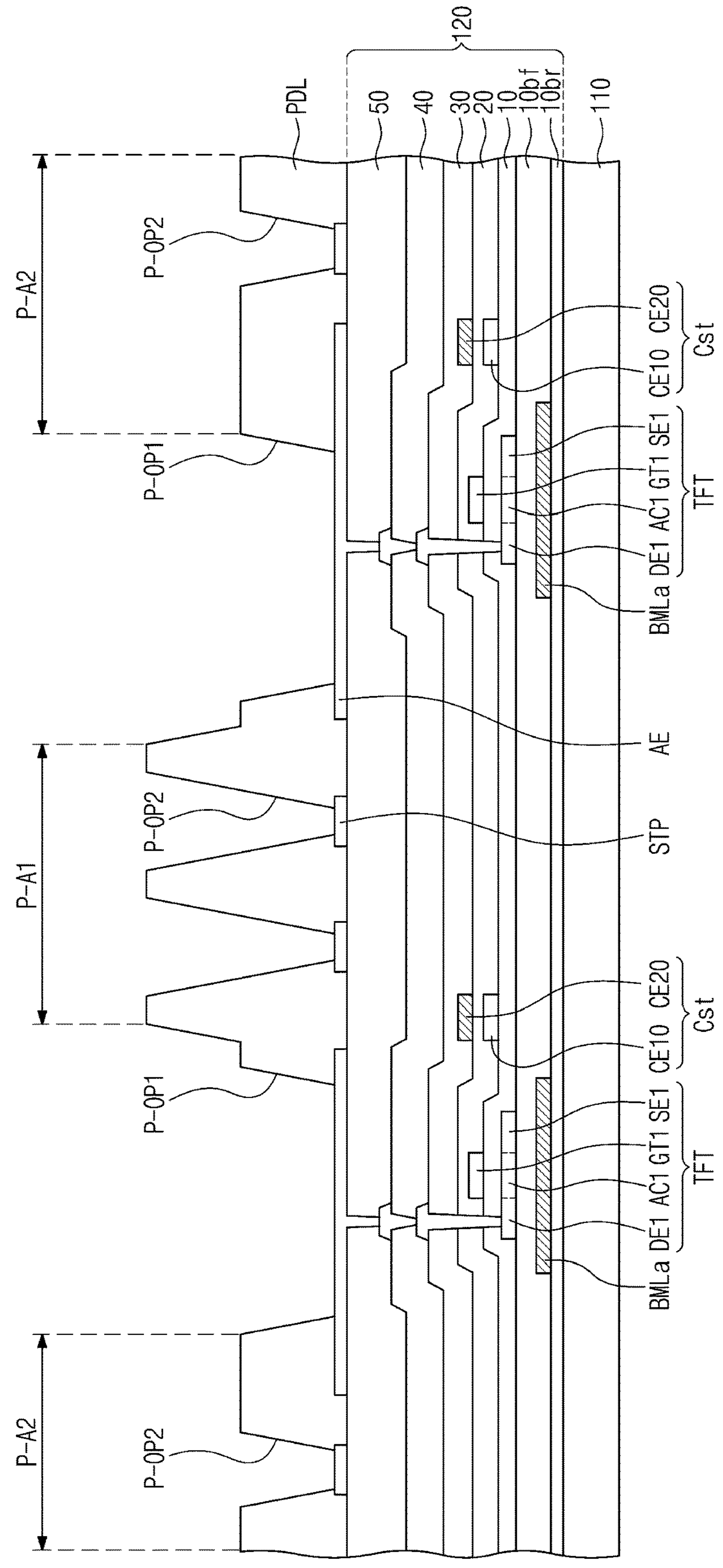

Referring to FIG. 7E, the mask pattern MSP is removed. The mask pattern MSP may be removed by an etching process. A portion of the stopper pattern STP may be etched in the process of removing the mask pattern MSP. For instance, an upper transparent conductive oxide layer of the stopper pattern STP having the multi-layer structure may be etched.

Figure 7F:
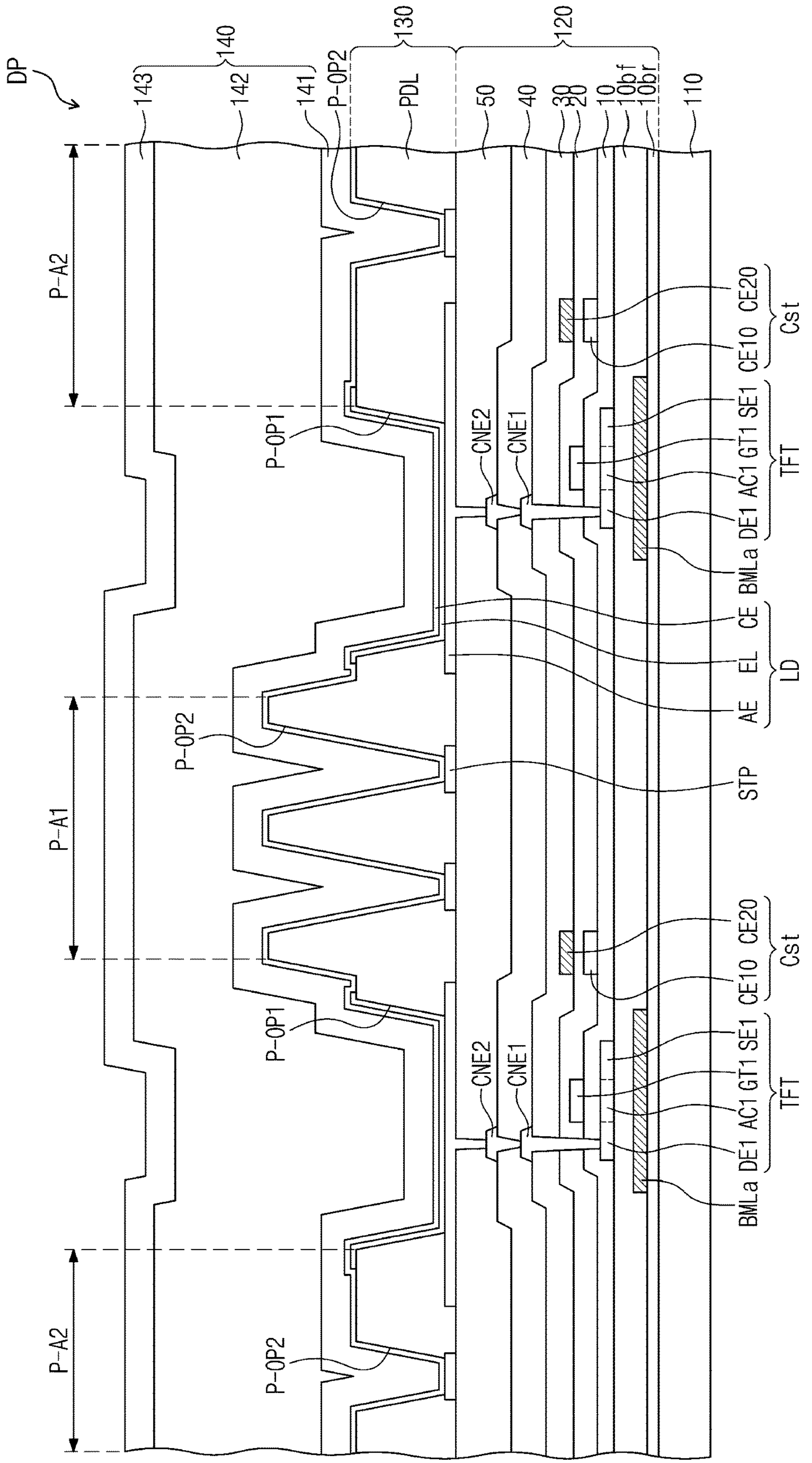

Referring to FIG. 7F, the second electrode CE may be formed after the light emitting layer EL is formed. The light emitting layer EL may be formed through a deposition process using a mask through which an opening is formed corresponding to the light emitting area LA. Then, the second electrode CE entirely overlapping the display area DD-DA (refer to FIG. 1A) is formed through a deposition process using an open mask.

Then, the thin film encapsulation layer 140 may be formed. The inorganic layer 141 may be formed through a deposition process using an open mask to entirely overlap the display area DD-DA (refer to FIG. 1A). The organic layer 142 may be formed through an inkjet process. In addition, the inorganic layer 143 may be formed through a deposition process using an open mask to entirely overlap the display area DD-DA (refer to FIG. 1A).

Figure 8:
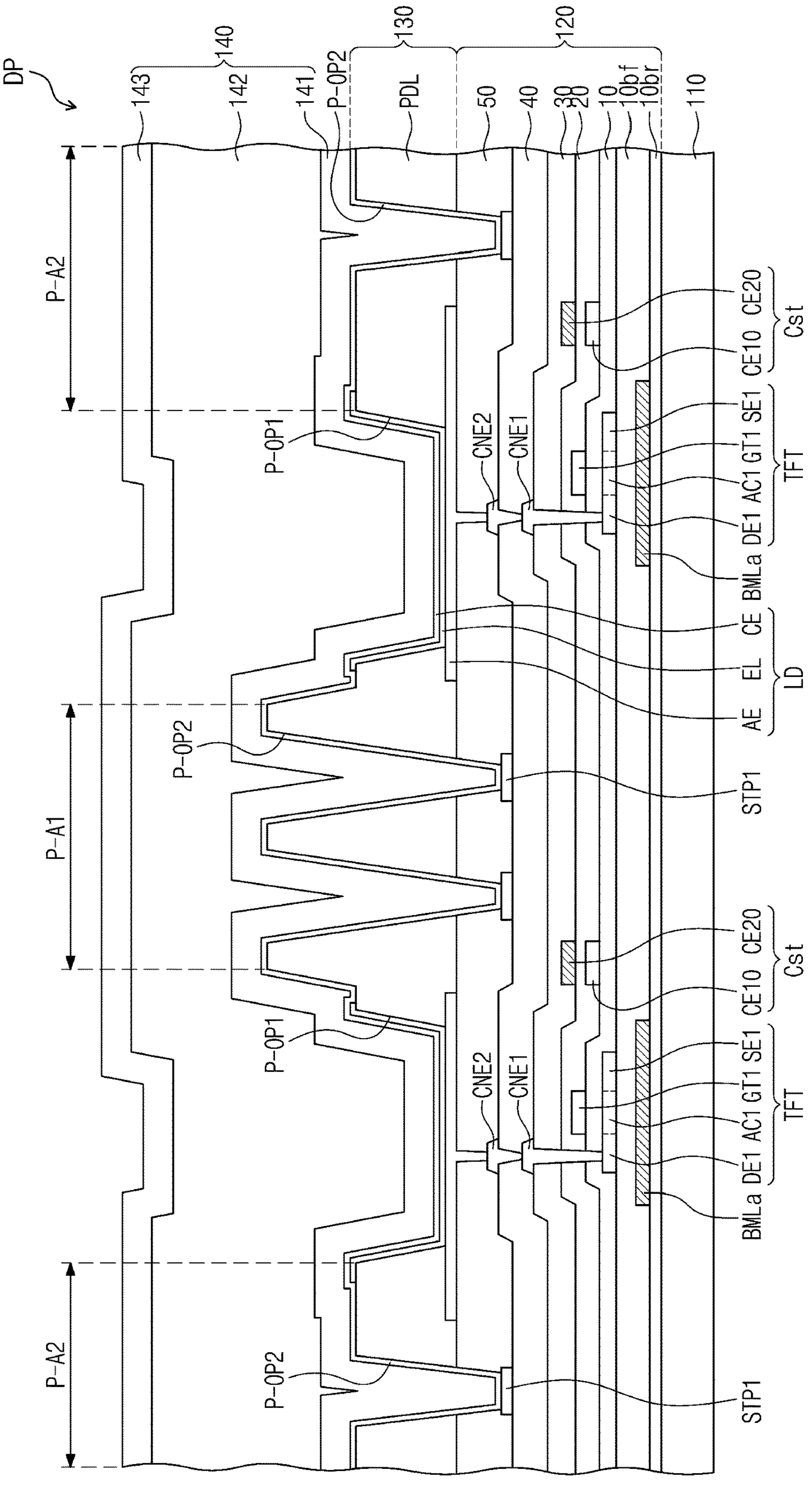
FIGS. 8 and 9 are cross-sectional views of a display panel according to embodiments of the present disclosure.
Figure 9:
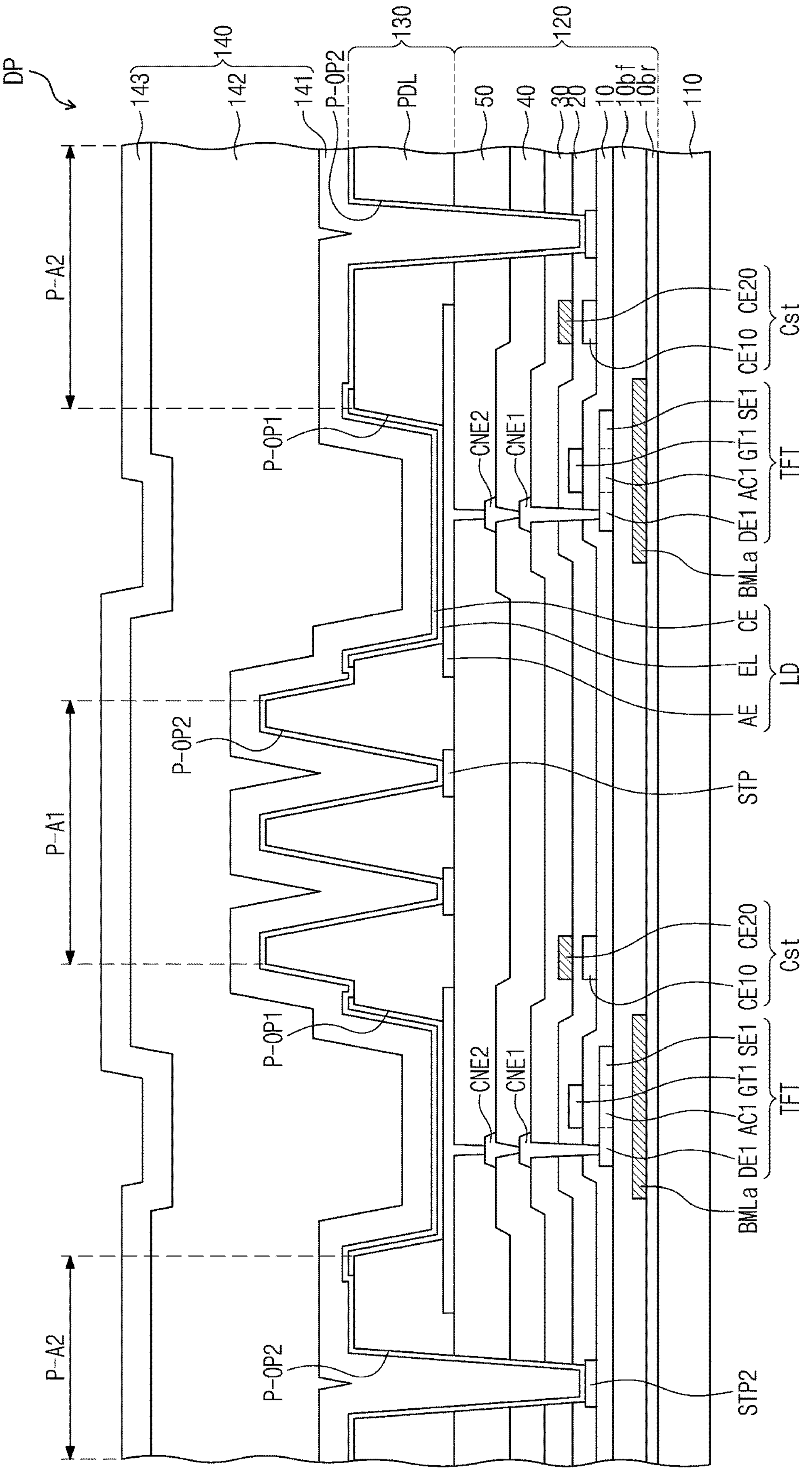

FIGS. 8 and 9 are cross-sectional views of a display panel according to embodiments of the present disclosure. Hereinafter, the cross-sectional views of FIGS. 8 to 9 are shown with respect to the cross-section of FIG. 6, and in FIGS. 8 to 9, detailed descriptions of the components described with reference to FIGS. 6 to 7F will be omitted.

Referring to FIG. 8, a location of a stopper pattern STP1 may be changed. The stopper pattern STP1 may be disposed under a first electrode AE and may be formed prior to the first electrode AE. The stopper pattern STP1 may be disposed on the same layer as a layer on which one of connection electrodes CNE1 and CNE2 are disposed. The stopper pattern STP1 may be formed through the same process as the connection electrodes CNE1 and CNE2, may include the same material as the connection electrodes CNE1 and CNE2, and may have the same stack structure as the connection electrodes CNE1 and CNE2. In FIG. 8, the stopper pattern STP1 disposed on the same layer as the second connection electrode CNE2 is shown as a representative example.

FIG. 9 shows two types of stopper patterns STP and STP2. A first stopper pattern STP may be substantially the same as the stopper pattern STP of FIG. 6. The second stopper pattern STP2 may be disposed under a first electrode AE and may be formed prior to the first electrode AE.

Referring to FIG. 9, the second stopper pattern STP2 may be disposed on the same layer as a layer on which the gate GT1 is disposed. The second stopper pattern STP2 may be formed through the same process as the gate GT1, may include the same material as the gate GT1, and may have the same stack structure as the gate GT1.

Referring to FIGS. 8 and 9, as some stopper patterns STP1 and STP2 are disposed under a fifth insulating layer 50, a depth of a second opening P-OP2 overlapping the stopper patterns STP1 and STP2 may increase. The second opening P-OP2 overlapping the stopper patterns STP1 and STP2 may further penetrate through the fifth insulating layer 50. In FIGS. 8 and 9, the second opening P-OP2 of the second area P-A2, which has the depth greater than that of the second opening P-OP2 of the second area P-A2 of FIG. 6, is shown. The second opening P-OP2 with the increased depth may increase a coupling force of the inorganic layer 141.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display device comprising:

a display panel, the display panel comprising:

a transistor;

an insulating layer disposed on the transistor;

a light emitting element electrically connected to the transistor and comprising a first electrode disposed on the insulating layer, a light emitting layer disposed on the first electrode, and a second electrode disposed on the light emitting layer wherein the light emitting element comprises a plurity of color light emitting elements;

a stopper pattern disposed spaced apart from the first electrode and on the insulating layer;

a pixel definition layer disposed on the stopper pattern and having a first opening extending through the pixel definition layer to the first electrode and a second opening extending through the pixel definition layer to the stopper pattern; and a thin film encapsulation layer disposed on the pixel definition layer and inside the second opening, and covering the light emitting element, wherein the stopper pattern is interposed between the insulating layer and the pixel definition layer so as to overlap the second opening entirely and the stopper pattern blocks the second opening from extending into the insulating layer wherein the second opening is located between at least two of the plurality of color light emitting elements in a plan view;

an electron transport layer is disposed under the second electrode in the second opening, wherein the second opening has a depth greater than a width, and wherein the stopper pattern is provided in a plural, and the plurality of stopper patterns are spaced apart from each other and electrically isolated from each other.

2. The display device of claim 1, wherein the stopper pattern is disposed on the insulating layer and comprises a same material as the first electrode.

3. The display device of claim 2, wherein the stopper pattern has a same layered structure as the first electrode.

4. The display device of claim 1, wherein the second electrode is disposed inside the second opening.

5. The display device of claim 1, wherein the thin film encapsulation layer comprises:

a first inorganic layer;

an organic layer disposed on the first inorganic layer; and a second inorganic layer disposed on the organic layer.

6. The display device of claim 1, wherein the stopper pattern is provided in plural, the second opening is provided in plural, and there is one of the stopper patterns at a base of the second openings.

7. The display device of claim 1, wherein the light emitting element comprises a plurality of first color light emitting elements, a plurality of second color light emitting elements, and a plurality of third color light emitting elements, and the stopper pattern is disposed in a non-light-emitting area defined between one light emitting element among the first color light emitting elements, the second light emitting elements adjacent to each other among the second color light emitting elements, and one light emitting element among the third color light emitting elements.

8. The display device of claim 7, wherein the stopper pattern is provided in plural, and two or more stopper patterns are disposed in the non-light-emitting area.

9. The display device of claim 1, wherein the pixel definition layer comprises:

a first area having a first thickness; and a second area having a second thickness smaller than the first thickness, and the second opening is defined in each of the first area and the second area.

10. The display device of claim 9, wherein the second opening defined in the second area further extends through the insulating layer.

11. The display device of claim 1, further comprising a connection electrode disposed between the transistor and the light emitting element and electrically connected to the transistor and the light emitting element, wherein the stopper pattern is disposed under the insulating layer and comprises a same material as the connection electrode.

12. The display device of claim 1, wherein the transistor comprises a semiconductor pattern and a gate, and the stopper pattern is disposed under the insulating layer and comprises a same material as the gate.

13. The display device of claim 1, further comprising an input sensor disposed on the display panel.

14. The display device of claim 13, further comprising an anti-reflective unit disposed on the input sensor, wherein the anti-reflective unit comprises a color filter overlapping the first opening and a light blocking pattern overlapping the second opening.

* * * * *